United States Patent
Casey et al.

(10) Patent No.: US 6,402,866 B1
(45) Date of Patent: Jun. 11, 2002

(54) POWDERED METALLIC SHEET METHOD FOR DEPOSITION OF SUBSTRATE CONDUCTORS

(75) Inventors: Jon A. Casey, Poughkeepsie; John U. Knickerbocker, Hopewell Junction; David C. Long; Brenda L. Peterson, both of Wappingers Falls, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/410,474

(22) Filed: Sep. 30, 1999

(51) Int. Cl.[7] .............................................. B32B 31/26
(52) U.S. Cl. ........................... 156/89.12; 156/89.16; 156/233; 156/234; 156/235; 156/581; 29/851
(58) Field of Search .................................. 156/230, 231, 156/233, 234, 235, 238, 239, 240, 89.12, 89.16, 540, 553, 581, 583.1; 29/851

(56) References Cited

U.S. PATENT DOCUMENTS

| | | | |
|---|---|---|---|
| 3,800,020 A | * | 3/1974 | Parfet |
| 4,614,837 A | * | 9/1986 | Kane et al. |
| 5,009,744 A | * | 4/1991 | Mandai et al. ........... 156/233 X |
| 5,026,748 A | | 6/1991 | Adams et al. |
| 5,174,842 A | * | 12/1992 | Hamuro et al. |
| 5,412,865 A | * | 5/1995 | Takaoka et al. ......... 156/235 X |
| 5,503,703 A | | 4/1996 | Dahotre et al. |
| 5,527,998 A | | 6/1996 | Anderson et al. |
| 5,948,200 A | * | 9/1999 | Nakazawa et al. ... 156/89.16 X |
| 6,074,893 A | * | 6/2000 | Nakata et al. |

FOREIGN PATENT DOCUMENTS

| | | | |
|---|---|---|---|
| JP | 2-42797 | * | 2/1990 |
| JP | 2-291194 | * | 11/1990 |
| JP | 3-64094 | * | 3/1991 |
| JP | 4-75312 | * | 3/1992 |
| JP | 5-175064 | * | 7/1993 |
| JP | 7-201567 | * | 8/1995 |
| JP | 9-237955 | * | 9/1997 |
| JP | 10-242644 | * | 9/1998 |
| JP | 10-256706 | * | 9/1998 |

* cited by examiner

*Primary Examiner*—Curtis Mayes
(74) *Attorney, Agent, or Firm*—DeLio & Peterson, LLC; John J. Tomaszewski; Ira D. Blecker

(57) ABSTRACT

A method and apparatus are provided for forming metal circuit patterns and other designs on greensheets and other substrates. The method and apparatus utilize a metal containing transfer sheet whereby selected portions of the metal containing transfer sheet are transferred to the greensheet forming the desired circuit pattern and then the transfer sheet removed. The metal containing transfer sheet may contain a release layer. Transfer methods include stamping, hot rolling, laser beam, heat, etc. and combinations thereof The transfer sheet may also have a stratified or graded vertical profile so that different conductivities or other circuit properties (transfer sheet adhesion, etc.) may be obtained in the formed pattern on the substrate.

17 Claims, 5 Drawing Sheets

POWDERED METALLIC SHEET METHOD FOR DEPOSITION OF SUBSTRATE CONDUCTORS

BACKGROUND OF THE INVENTION

1. Field of the Invention

The present invention relates to forming conductor circuit patterns on electronic substrates such as multilayer ceramic substrates and, more particularly, to forming metal conductor circuit patterns on an unsintered greensheet used to make the multilayer ceramic substrate.

2. Description of Related Art

Ceramics have found widespread use in the electronics industry as a substrate for integrated circuit packages. In general, metalized circuit patterns are applied to a ceramic substrate which is in the form of an unsintered greensheet, and a plurality of the metalized ceramic greensheets are stacked and laminated and co-sintered to create a monolith of substrate and three-dimensional metal circuitry. The ceramic greensheets are constructed by combining ceramic particles and organic binders and forming into unfired, or "greensheet", tape.

The casting of suspensions of ceramic material to form layers or greensheets which are then laminated and sintered to make a ceramic substrate electronic article is well-known in the art. The doctor blade method is one method for making a ceramic greensheet and typically, ceramic powder is mixed with an organic solvent, a plasticizer and a binder forming a slurry, the slurry is cast in a regulated thickness on a carrier film with the aid of a doctor blade, and the applied layer of the slurry and carrier film is then dried. The ceramic containing formula typically uses a ceramic such as alumina and a butyral type resin like polyvinyl butyral as the binder.

Once the greensheets are formed, via holes are formed in a predefined pattern in the greensheet and the via holes then filled with a conductive paste. Metal lines in a form of circuitry are then formed on the surface of the greensheet by screening or extrusion printing on the conductive paste. The conductive paste is formed of a suitable particulate metallic material such as molybdenum which will withstand the subsequent sintering process. The metalized sheets are then stacked, laminated and fired in an appropriate atmosphere to form a monolithic MLC substrate with a complex internal circuitry.

The process of extrusion or screen printing to create conductive patterns using conductive paste has several drawbacks however. These processes are typically referred to as wet processes and these type processes can distort the dimensions of the greensheet as the solvents and oils in the metallic paste are absorbed into the greensheet. Further, after screening, the sheets must be dried in an oven which adds another process step and inherent problems into the circuitry forming process. These wet type processes also generate large amounts of waste chemicals and need costly treatment and disposal processes.

The use of a wet screening process also makes it commercially impractical to form a conductive circuit pattern on the greensheet which is stratified or graded, e.g., in conductivity, in a plane transverse to the circuit design. Grading of the conductive path or feature is important for certain electronic components as discussed hereinbelow and using a wet screening process would require a first screening with a bottom layer paste and then drying the screened paste. A second screening pass would then be made with a second type paste and then drying the second layer. Such a screening process would require perfect conductor alignment which is difficult if not impossible. In manufacturing multilayer substrates it is important to use processes which provide high productivity, high yield, low cost and pass the necessary electrical tests.

Bearing in mind the problems and deficiencies of the prior art, it is therefore an object of the present invention to provide a method for forming a metalized circuit pattern on a greensheet, other electronic component substrate or any other substrate which minimizes many of the problems of the wet processes of the prior art and provides a patterning method having high productivity, high yield and low cost.

It is another object of the present invention to provide a method for making a multilayer ceramic substrate electronic component wherein the circuitry on the substrate layers is formed using a patterning method which has high productivity, high yield and low cost.

A further object of the present invention is to provide a method for making a metal containing transfer sheet for forming metalized circuit patterns on a greensheet, other electronic component substrate or any other substrate.

It is yet another object of the present invention to provide an apparatus for forming a metalized circuit pattern on a greensheet, other electronic component substrate or any other substrate.

An additional object of the present invention is to provide an apparatus for making a multilayer ceramic substrate electronic component.

It is further object of the present invention to provide a metalized circuit patterned greensheet which is made using a patterning method providing high productivity, high yield and low cost.

It is an additional aspect of the present invention to provide a greensheet, electronic component substrate or other substrate containing a conductive metal pattern formed on the substrate surface in a desired circuit pattern wherein the conductive pattern is layered with different materials or vertically graded in conductivity or other properties.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for making metalized circuit pattern; on a greensheet or other electronic component substrate comprising:

forming a metal containing transfer sheet comprising a metal powder and a binder;

applying the metal containing transfer sheet on the surface of a greensheet or electronic component substrate;

transferring and adhering a portion of the metalized transfer sheet in a desired metalized circuit pattern from the metal containing transfer sheet to the greensheet and forming the metalized circuit pattern on the greensheet surface; and removing the remainder of the metal containing transfer sheet from the greensheet leaving the patterned greensheet product.

In a further aspect of the invention the desired circuit pattern is transferred from the metal containing transfer sheet to the greensheet or other electronic component substrate by heat, pressure, stamping, laser, or other similar transfer methods or combination of methods.

In a further aspect of the invention multilayer ceramic electronic component substrates are made by a method comprising:

provided a plurality of greensheet substrates suitable for forming into a multilayer ceramic substrate;

forming a metal containing transfer sheet comprising a metal powder and a binder;

applying the metal containing transfer sheet on the surface of the greensheet;

transferring and adhering a portion of the metal containing transfer sheet in a desired pattern from the metal containing transfer sheet to the greensheet forming the desired circuit pattern on the greensheet surface;

removing the remainder of the metal containing transfer sheet from the greensheet leaving the greensheet having the desired circuit pattern thereon;

repeating the above procedure for the number of greensheets to be used to make the multilayer ceramic substrate;

stacking the pattern containing ceramic greensheets; and laminating and sintering the stacked ceramic greensheets forming the multilayer ceramic electronic component substrate.

In another aspect of the invention an apparatus is provided for making a greensheet having a metalized circuit pattern thereon comprising:

means to hold and support a greensheet;

means to hold and support a metal containing transfer sheet on the greensheet, the metal containing transfer sheet comprising a metal powder and a binder;

means to transfer and adhere a portion of the metal containing transfer sheet to the greensheet in a desired pattern on the greensheet surface; and means to remove the remainder of the metal containing transfer sheet not transferred to the greensheet leaving a metalized patterned greensheet having the desired circuit pattern thereon.

In another aspect of the invention the transfer means may be a punch (stamp), laser, raised roller, heat, or other such transfer means or combination of means which transfers a portion of the metal containing transfer sheet to the surface of the greensheet in a desired circuit pattern and leaves the remainder of the metal containing transfer sheet.

In a further aspect of the invention metalized circuit patterned greensheets and other electronic component substrates are provided which are made using the method and apparatus of the invention.

In a further aspect of the invention the metalized pattern on a greensheet or other substrate may be functionally graded (e.g., conductivity, etc.) in vertical cross section using a functionally graded metal containing transfer sheet so as to provide an electronic component in which the metalized circuit design has various properties across its cross-section and therefore may provide various functions in the electronic component. In another aspect, glass and/or ceramic can be included in the metal containing transfer sheet to provide additional transfer sheet bonding properties and adhesive properties for adhering the transferred sheet to the substrate.

In an additional aspect of the invention metal containing transfer sheets are provided for transferring a metal pattern onto a substrate such as a greensheet.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
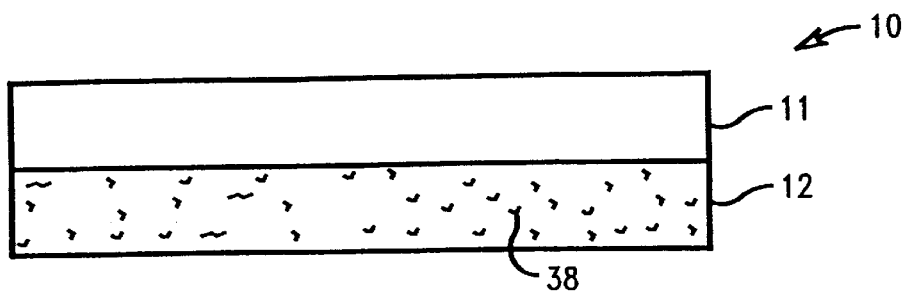
FIG. 1 shows a metal containing transfer sheet of the invention comprising a metal containing layer and a release layer.

In describing the preferred embodiment of the present invention, reference will be made herein to FIGS. 1–6C of the drawings in which like numerals refer to like features of the invention. Features of the invention are not necessarily shown to scale in the drawings.

The description will be directed to ceramic greensheets although it will be appreciated by those skilled in the art that other electronic component substrates and other substrates may be patterned with metal using the method and apparatus of the invention.

The ceramic greensheets may be made using known techniques as described in U.S. Pat. No. 2,966,719 to Park, Jr., which patent is hereby incorporated by reference. The greensheet casting composition typically termed the casting slip may be prepared by mixing the ingredients in a ball mill for a number of hours, such as 8 hours, to insure that a homogeneous mixture is formed and desired viscosity obtained. The ceramic material, typically alumina, having the desired particle size and particle size distribution is used to make the casting composition. The binder may be selected from a wide variety of polymers such as polyvinyl butyral, polyvinyl alcohol or an acrylic resin. Solvents to form a slurry which can be cast into a sheet may be selected from a wide variety of materials such as methylethylketone (MEK), methanol, acetone, etc. A plasticizer such as dibutylphthlate is also preferably used in the formulation.

After the ingredients of the casting composition are mixed and homogenized, a slip is formed which is typically de-aired by means well known in the ceramic art. After de-airing, the slip is transferred to a slip reservoir where it is suitably maintained in a homogeneous state. From the reservoir, the slip is discharged through a small orifice onto a substantially horizontal flexible casting sheet tape, typically made of an impervious material such as Teflon, Mylar, and the like. The casting sheet tape is pulled across the open bottom of the reservoir and under a doctor blade which is fixed at a particular height to form the desired casting thickness. The casting sheet tape is supported on a smooth surface and then the solvent evaporated producing a level hard tape. The tape is then punched to the desired greensheet substrate size. Greensheets are typically about 0.05 to 0.5 mm thick.

The greensheet is then typically punched to form vias and the greensheet would then be metalized using the prior art processes to form a metalized circuit patterned greensheet. The patterned greensheets are then stacked to form the desired multilayer ceramic substrate which is then laminated and fired (sintered) to form the final MLC product.

The fabrication of the metal containing transfer sheet is similar to the method used to form the ceramic greensheet and generally comprises mixing metal containing powder with an organic binder and solvent to form a slurry capable of being cast into thin sheets. The solvent is removed from the cast sheet forming a sheet of metal powder and organic binder. The thin metal containing transfer sheet can be mechanically punched or otherwise processed to transfer a portion of the metal sheet onto a greensheet to form a desired pattern of the metal on the greensheet surface. In general, the thickness of the metal containing transfer sheet may vary widely and is typically about 0.005 to 0.1 mm, preferably 0.01 to 0.05 mm. A release layer may also be used and is typically about 0.005 to 0.1 mm, preferably 0.01 to 0.02 mm.

A variety of metal containing powders may be used to form the metal containing transfer sheet. For example, molybdenum, tungsten, copper and nickel may be used as the metal. The metal particle size is typically about 0.5 to 5.0 microns. The organic binder may also vary widely and may be material such as polyvinyl butyral, polymethyl methacrylate, polyethyl methacrylate or acrylic copolymers. Solvents include MEK, acetone, etc.

Depending on the metal pattern desired, the composition of the metal containing transfer sheet may vary widely. In general, the metal containing transfer sheet comprises, by weight %, about 60 to 99, preferably 8 to 99 metal powder and the balance binder. The solvent is substantially evaporated from the final formed sheet.

The working slurry to form the metal containing sheet comprises, by volume%, about 10 to 50% metal powder, preferably 20 to 40%, 5 to 20% binder, preferably 10 to 15% and 30 to 80% solvent, preferably 40 to 70%.

The cast metal containing transfer sheet will typically be dried to remove any solvent and this may be performed generally at a temperature of 30 to 70° C. for 0.5 to 2 hours.

The metal containing transfer sheet may also contain particles of glass and/or ceramics or other additives to provide specific properties to the transfer sheet. For example, silicate glass acts as a bonding agent to increase the interfacial strength of the sheet to the ceramic sheet after sintering. Ceramics are useful to control shrinkage of the sintered sheet. The additives may be used in widely varying amounts in the sheet, by weight %, 5 to 65%, preferably 10 to 40%. The additive amounts will vary depending on the amount of metal in the sheet or layer of the sheet. In a transfer sheet containing additives, the sheet comprises, by weight %, about 1 to 99 metal powder, about 99 to 1 additive(s) and the balance binder. For a layered transfer sheet as in FIG. 4, one of the layers may be mostly metal and another layer mostly glass and/or ceramic. Solvents are used as needed to form a slurry for casting.

At this point, both the greensheets (typically via punched and via metalized) and metal containing transfer sheets have been made and the method and apparatus of the invention may now be used to from a metallic circuit pattern on the surface of the greensheet. With regard to the metal containing transfer sheets and transfer of a portion of the sheet to a substrate, a number of different sheets can be made and a number of different methods and apparatuses can be used to transfer the desired portion of the metal containing transfer sheet to the greensheet forming the desired circuit pattern thereon. This will be exemplified with regard to the figures.

Referring to FIG. 1, a metal containing transfer sheet is shown generally as and comprises a release layer 11 and a metal containing layer 12. The metal containing layer 12 adheres to the release layer 11 and when a force, heat or other transfer means or combination of means is applied to the release layer 11 of the metal containing transfer sheet 10, the desired portions of metal containing layer 12 are transferred to the greensheet substrate with the remaining non-transferred portions of layer 12 still adhering to the release layer 11. After the transfer to the greensheet is complete, the release layer 11 is removed leaving the desired circuit pattern on the substrate.

Figure 2:
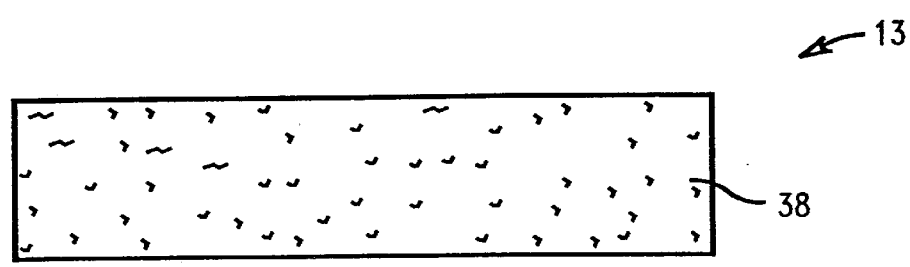
FIG. 2 shows another metal containing transfer sheet of the invention wherein metal powder is homogeneously dispersed in a binder.

FIG. 2 shows a metal containing transfer sheet 13 in which metal particles 38 are uniformly dispersed in the transfer sheet. It should be noted that the transfer sheet 13 is different from the transfer sheet of FIG. 1 in that there is no release layer. As described below, this type transfer sheet 13 is generally used by stamping or otherwise cutting the transfer sheet forming and adhering the desired pattern on the substrate and then removing from the greensheet the remaining portion of the transfer sheet not transferred from the transfer sheet to the greensheet substrate.

Figure 3:
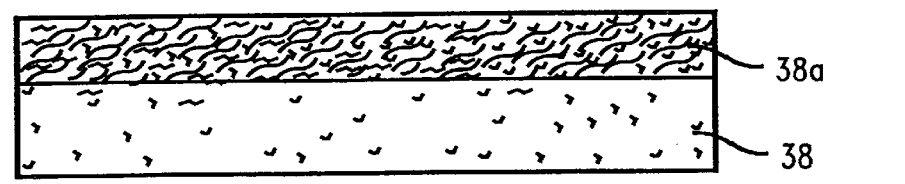
FIG. 3 shows another metal containing transfer sheet of the invention in which the metal is vertically graded in the sheet.

FIG. 3 shows a metal containing transfer sheet generally as 14 in which the metal particles are dispersed in a vertical stratified (graded) distribution in the sheet. Thus, metal particles 38a at the upper portion of the sheet 14 are more densely packed than metal particles 38 at the lower portion of the sheet. The resulting metal containing transfer sheet may be used to form circuitry where more metal is required at the top surface of the circuit for improved soldering or brazing properties. Also for uniform metallurgy for improved electroplating. The lower portion of sheet 14 has higher ceramic and glass content for improved adhesion to the ceramic substrate after sintering.

Figure 4:
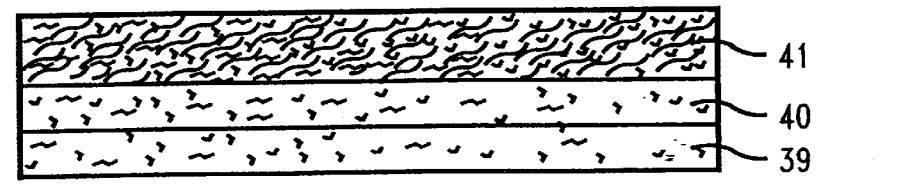
FIG. 4 shows another metal containing transfer sheet of the invention which comprises a number of layers each layer having a different metal particle density.

Referring to FIG. 4, a layered metal containing transfer sheet is shown generally as in which three separate layers comprise the transfer sheet. The layers are shown as 39, 40 and 41 and are typically produced by laminating three different sheets together usually after they are made and dried. The metal containing transfer sheet 15 may also be made by doctor blading the different layers over a previously constructed base layer. In this method a base layer 39 is formed and then layer 40 doctor bladed onto the surface of layer 39. After layer 40 is cured, another layer 41 can be doctor bladed onto layer 40 forming the tri-layered metal containing transfer sheet 15. Further, in the layered transfer sheet shown in FIG. 4 there is a high density of metal particles for improved soldering and plating properties shown in layer 41 and a lower density of metal particles shown in layer 40. Layer 39 contains even fewer metal particles and with more ceramic and glass particles for good adhesion to the ceramic substrate. Such a layered metal containing transfer sheet may be used for circuitry applications such as I/O pads and contact pads for soldering or joining components.

Figure 5A:
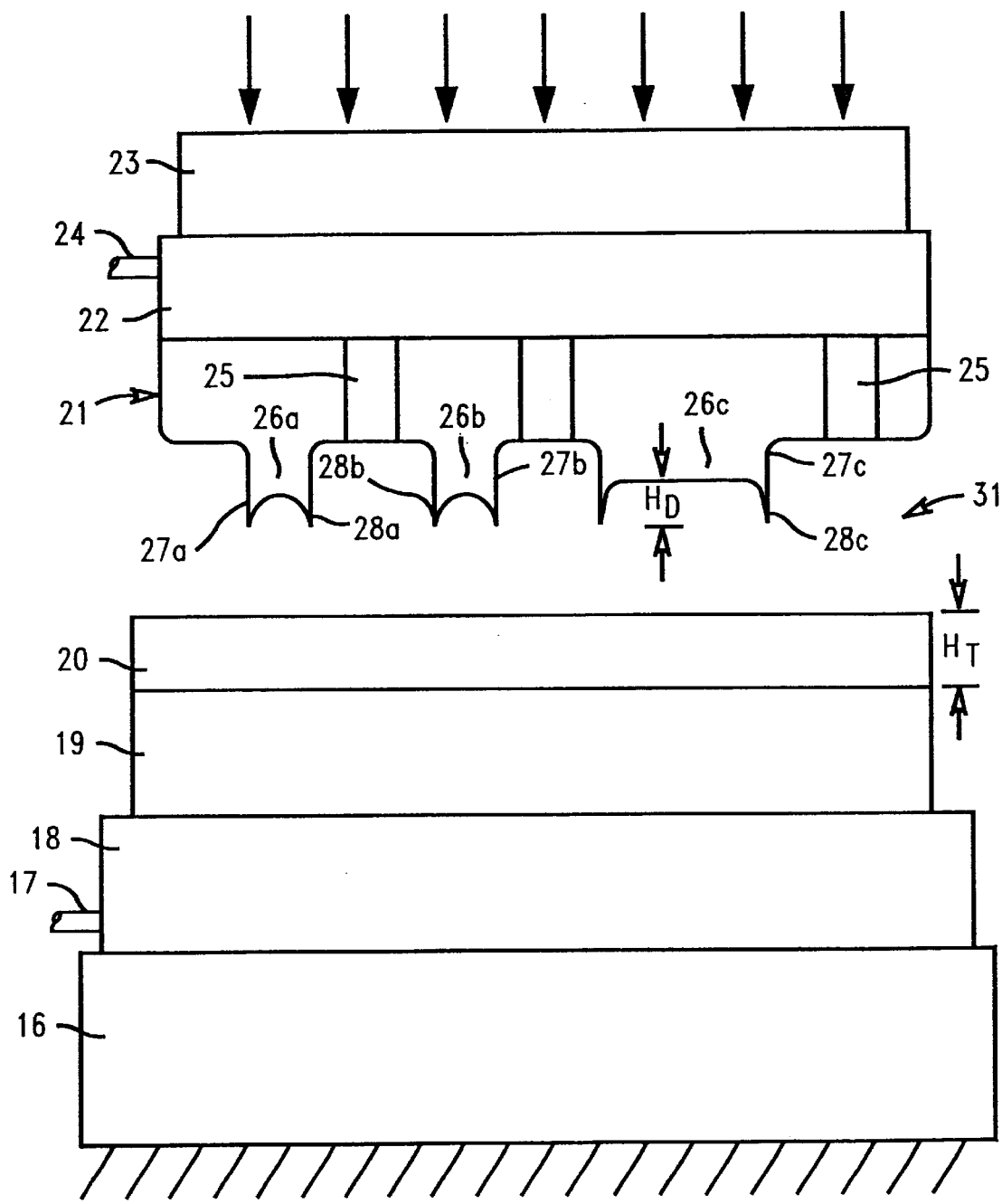
FIGS. 5A–5C show, in sequence, the patterning of a greensheet with metal conductive circuitry using a metal containing transfer sheet in a stamping apparatus and method.
Figure 5B:
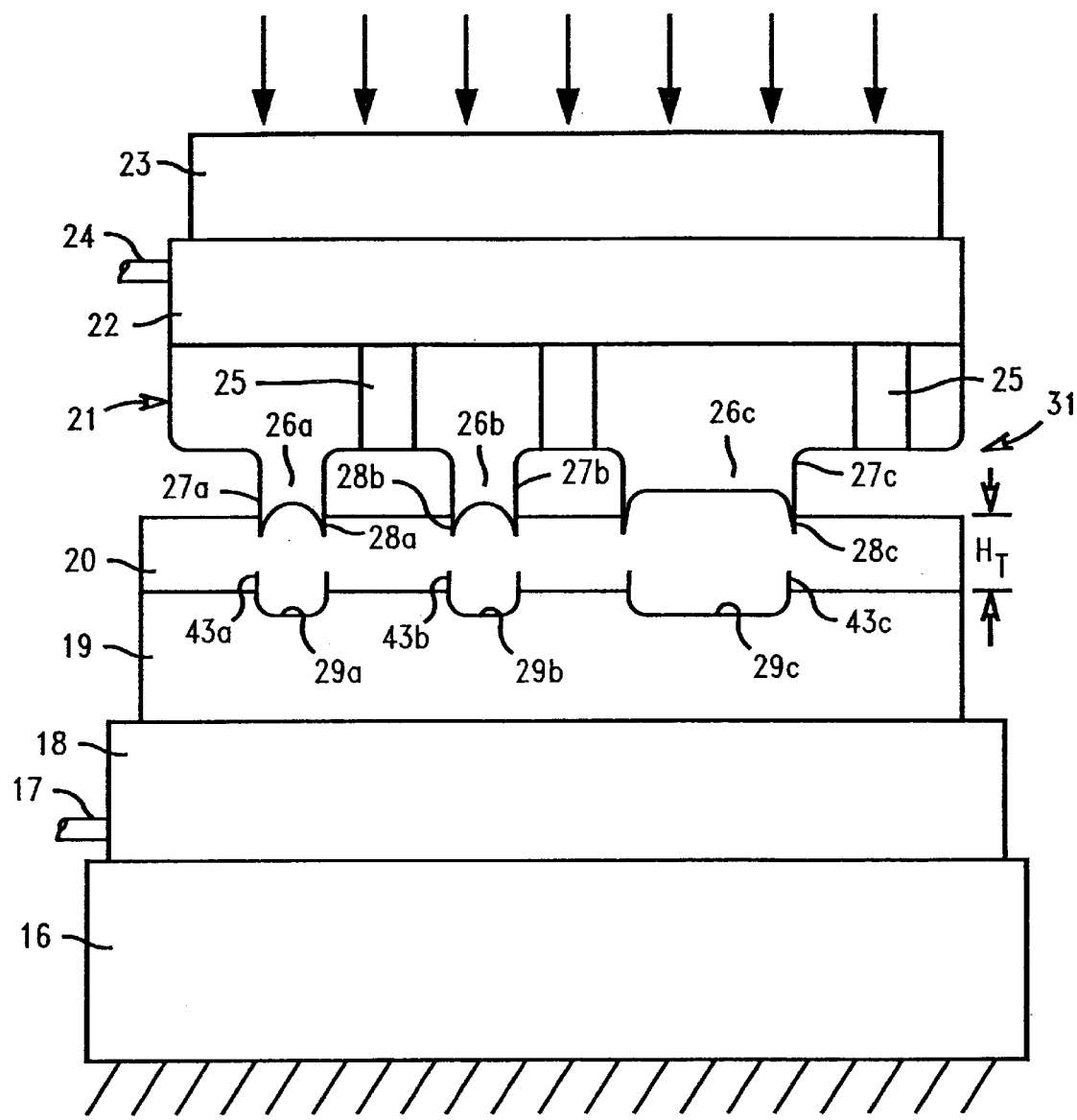
Figure 5C:
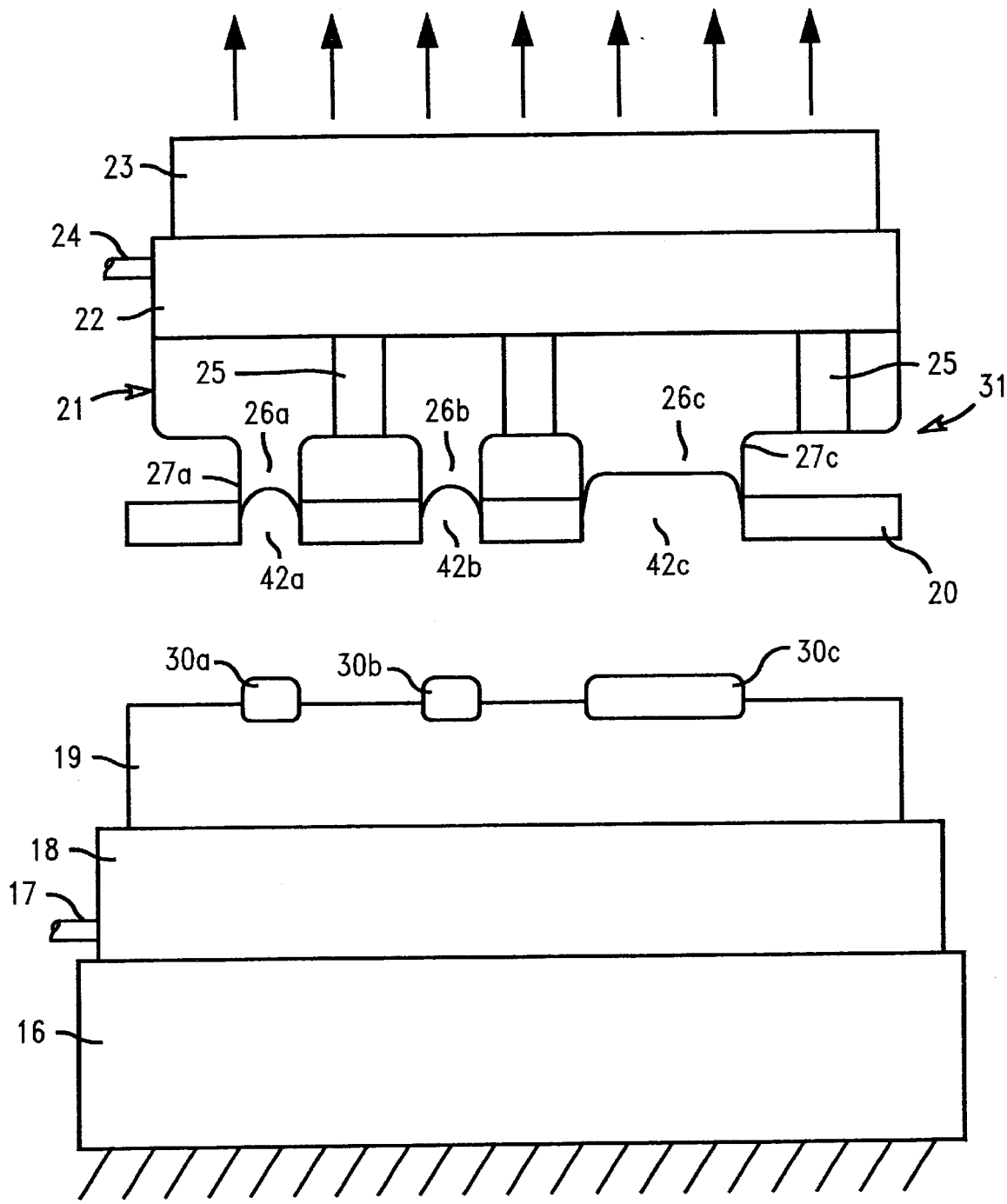
Figure 6:
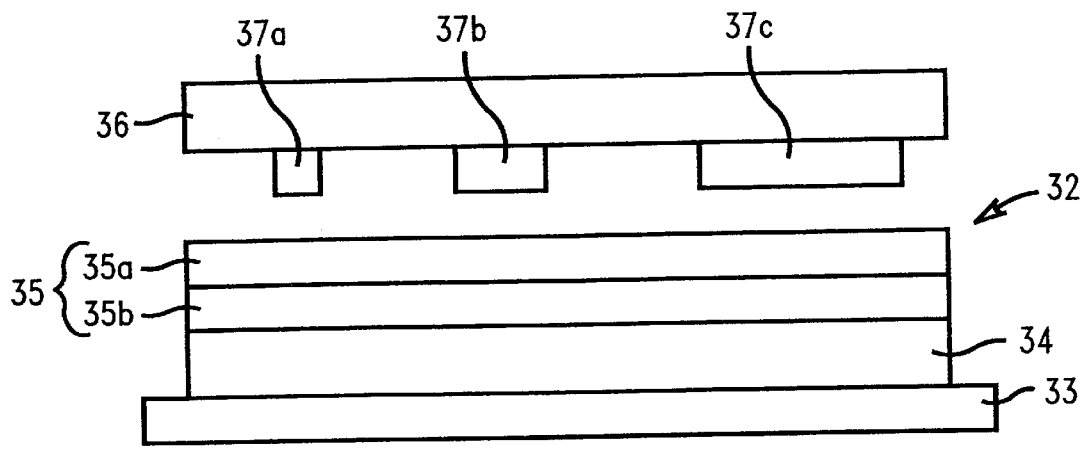
FIGS. 6A–6C show, in sequence, the patterning of a greensheet with a metal containing transfer sheet comprising a metal containing layer and a release layer using a roller apparatus and method.
Figure 6:
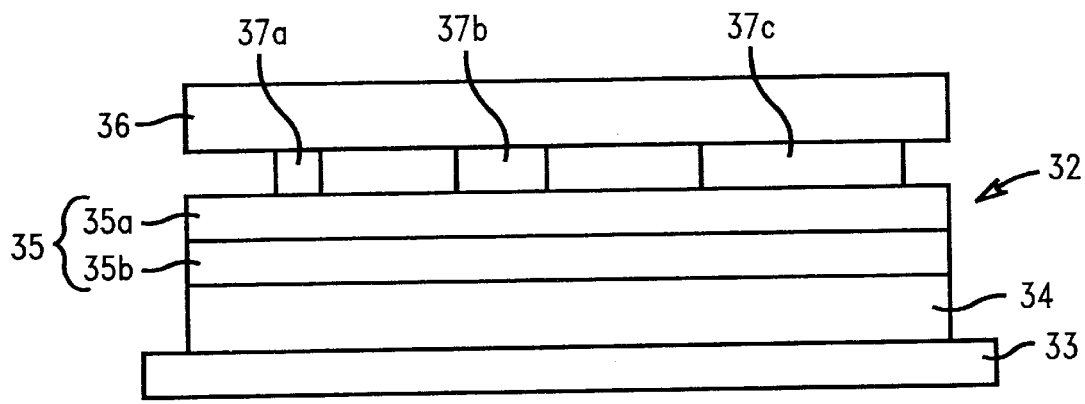
Figure 6:
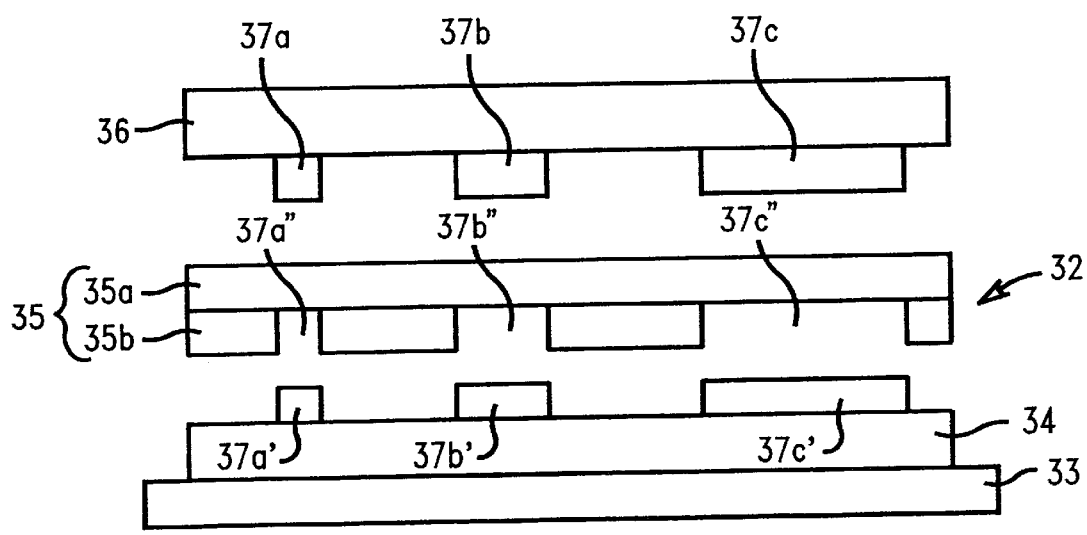

Referring to FIGS. 5A–5C, a transfer press plate apparatus of the invention is shown generally as 31 and the method of operation of the apparatus to form a circuit pattern on a greensheet is demonstrated in the sequence of the figures.

Referring first to FIG. 5A, the pressure plate apparatus 31 is shown at the beginning of its stroke to form a pattern on a greensheet and comprises a machine press base plate 16 on which is a porous vacuum plate 18 having a vacuum port 17. A greensheet 19 is positioned on top of porous vacuum plate 18 and when a vacuum is applied through vacuum port 17 the greensheet 19 is secured to the surface of the porous vacuum plate 18.

A machine press movable upper plate is shown as 23 and has attached thereto a porous vacuum plate 22 with a vacuum port 24. A hot stamp plate 21 is secured to the porous vacuum plate 22 when a vacuum is applied through vacuum port 24 or otherwise fastened thereto. Heat may be supplied to the hot stamp plate through upper plate 23.

Hot stamp plate 21 has a number of raised features shown as 27a, 27b and 27c. Each raised feature has two (2) corresponding knife edges 28a, 28b and 28c forming the outer dimensions of the raised feature. A metal containing transfer sheet is shown as 20 and is positioned on the surface of greensheet 19. The sheet has a height $H_T$. The raised features 27a, 27b and 27c have a stamp height $H_D$.

Referring to FIG. 5B, in operation to form a metal containing pattern on greensheet 19, the movable upper plate 23 is moved downward in the direction of the arrows so that the raised features 27a, 27b and 27c and their corresponding knife outer edges 28a, 28b and 28c intersect and cut into the metal containing transfer sheet 20. This forms separated portions of the metal containing transfer sheet shown as 29a, 29b and 29c which portions would be forced against and into and adhered to greensheet 19 as shown hereinbelow. Corresponding stress cracks 43a, 43b and 43c are formed in the transfer sheet during the stamping operation. The central portions 26a, 26b and 26c of the raised features are preferably concave to form the pressed metal in the shape of a raised conductor line. The central portions 26a, 26b and 26c are preferably smaller in height than the thickness of the metal containing sheet 20. This provides a compressive force to the metal containing sheet and greensheet 19 forcing the cut metal portion of the sheet into the surface of the greensheet. $H_D$ shown in FIG. 5A is preferably less than $H_T$. FIG. 5B shows the machine press nearly at the bottom of its stroke. At the bottom of its stroke the knife outer edges 28a, 28b and 28c would preferably contact or almost contact the upper surface of greensheet 19 stamping the desired circuit pattern on the greensheet.

Referring now to FIG. 5C, the separated and compressed portions 29a, 29b and 29c of FIG. 5B are adhered to greensheet 19 and are shown as circuit patterns 30a, 30b and 30c on greensheet 19. They are preferably indented slightly into the surface of greensheet 19 providing additional adherence of the circuit patterns 30a, 30b and 30c to the greensheet. There are corresponding openings in the metal containing transfer sheet 20 shown as 42a, 42b and 42c which are where portions of the metal containing transfer sheet have been removed to form the desired circuit pattern on the greensheet. Generally the metal containing transfer sheet 20 will adhere to the hot stamp plate 21 after the transfer operation aided by the vacuum reaching 20 through holes in plate 21 from vacuum plate 22.

FIG. 5C shows the movable upper plate 23 of press plate apparatus 31 moved upward away from greensheet 19 at the end of its stroke with metal containing transfer sheet 20 adhering to hot stamp plate 21. Accordingly, the greensheet 19 now contains on the surface thereof metal containing sheet portions shown as circuit patterns 30a, 30b and 30c. The metal containing transfer sheet 20 has corresponding opening therein 42a, 42b and 42c corresponding to the transferred portions of the metal containing sheet.

At this point in the method and use of the apparatus, the used and partially depleted metal containing transfer sheet would be removed from the hot stamp plate 21 and the patterned greensheet removed and a new metal containing transfer sheet 20 and a new greensheet 19 used to make the next patterned greensheet. This procedure is repeated for the desired number of greensheets to be made using the method and apparatus of the invention.

It will be appreciated that the press plate apparatus 31 may be controlled to automatically supply new greensheets 19 and new metal containing transfer sheets to be processed and then, after stamping or otherwise transferring the desired metal portion of the transfer sheet to the greensheet, the circuit containing greensheet 19 and depleted metal containing transfer sheet removed and a new greensheet and metal containing sheet positioned for the metal transfer process.

The hot stamp plate 21 shown in FIGS. 5A–5C may be fabricated by any number of methods. In one method a metal plate is machined by milling, etc. to form the raised circuit features 27a, 27b and 27c. Also, photolithographic techniques can be used wherein a photoresist is patterned and then etched. Alternately, a photoresist may be applied to the surface, etched and then the etched portion plated to form the raised features.

The hot stamp plate 21 may be made from a variety of materials such as ceramics, metals, filled plastics, etc. The surfaces of the raised features 27a, 27b and 27c may be coated with hard coatings such as TiN, diamond, chrome, ceramics, etc. for increased wear resistance. Further, a low surface energy release coating can be used on the stamp surfaces to prevent sticking to the greensheet and/or metal containing transfer sheet.

To fabricate the metal containing transfer sheet a slurry is formed containing the desired powered metal which may be molybdenum, copper, tungsten, nickel and the like. A binder material such as polymethylmethacrylate, polyvinyl butyral or polycarbonate may be used. Ceramic materials or glasses such as alumina, silicate glasses or glass ceramic may also be added to form a metal containing transfer sheet having specialized properties such as for graded patterns and where glass improves adhesion to ceramics for the metal and the ceramic controls shrinkage caused by sintering. A solvent such as acetone, MEK, MIBK, IPA, MeOH is typically used to form the slurry. The slurry is then doctor bladed onto a film carrier and then dried and then removed from the film carrier forming the metal containing transfer sheet.

Referring to FIGS. 6A–6C, a sequence of steps is shown using a transfer apparatus shown generally as 32 to transfer a metalized pattern onto a greensheet from a metal containing transfer sheet with a release layer.

In FIG. 6A, the transfer apparatus is shown generally as 32 comprises a vacuum chuck 33 to which is held a greensheet 34. A metal containing carrier sheet with a release layer is shown generally as 3 and comprises a release upper layer 35a and a metal containing lower layer 35b adhered to the release layer. A hot metal pattern plate or roller or laser is shown as 36 and has pattern features 37a, 37b and 37c thereon.

In FIG. 6B, the pattern plate 36 is moved downward toward the metalized carrier sheet 35 and the patterned features 37a, 37b and 37c contact the upper release layer 35a of the transfer sheet 35. A pressure force or heat or laser or other means or combination of means is then initiated to bond the pattern features 37a, 37b and 37c to the upper surface of greensheet 34. The non-contacted portions of metal containing carrier sheet 35 are not affected and the non-contacted portions of metal layer 35b not transferred to the greensheet.

In FIG. 6C, the transfer of the pattern 37a, 37b and 37c on to the surface of greensheet 34 can be seen as corresponding patterns 37a', 37b' and 37c'. The resulting transfer sheet 35 is removed with the release sheet 35a remaining intact and the metal containing layer 35b having corresponding openings 37a", 37b" and 37c" where the metal containing layer was removed and adhered to the greensheet 34. The pattern plate 36 is now positioned above the patterned greensheet 34 and when the patterned greensheet 34 and the depleted transfer sheet 35 are removed a new greensheet 34 and transfer sheet 35 may be placed under the plate and the operation repeated to form a new patterned greensheet.

As noted above, the metal containing greensheet shown generally as 10, 13, 14 and 15 in FIGS. 1–4, respectively, can be used in the method and apparatus of the invention to form circuit patterns on greensheets. Depending on the metal containing transfer sheet used, a pattern may be transferred to a substrate and then the remainder of the metal containing transfer sheet removed by pealing off the release layer and adhering remaining metal containing transfer sheet. In the case of the metal containing transfer sheet not containing a release layer as shown in FIGS. 2–4, other means can be used to remove the depleted transfer sheet from the patterned greensheet using vacuum or other means for example.

Using the metal containing transfer sheet 13 in FIG. 2 a homogeneous circuit pattern will be formed. Using the metal stratified transfer sheet 14 in FIG. 3, a circuit pattern is obtained wherein the metal is denser at the top of the transferred pattern than at the bottom. Using the transfer sheet 15 of FIG. 4, a dense layer of metal is shown at the top of the transferred pattern followed by an intermediate less dense metal layer followed by a low density metal containing or no metal containing lower portion. As discussed above, the lower portion 39 may contain more glass and/or ceramic to provide better adhesion of the transfer sheet to the substrate. Each of the above circuit configurations have their own desirable circuit characteristics depending on the type electronic component desired.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for making metalized circuit patterns on a greensheet or other electronic component substrate comprising:
    forming a metal containing transfer sheet without a release layer comprising a metal powder and a binder;
    applying the metal containing transfer sheet on the surface of a greensheet or electronic component substrate;
    transferring and adhering a portion of the metalized transfer sheet in a desired metalized circuit pattern from the metal containing transfer sheet to the greensheet and forming the metalized circuit pattern on the greensheet surface; and
    removing the remainder of the metal containing transfer sheet from the greensheet leaving the patterned greensheet product.

2. The method of claim 1 wherein the desired circuit pattern is transferred from the metal containing transfer sheet to the greensheet or other electronic component substrate by heat, pressure, stamping, laser, or a combination thereof.

3. The method of claim 1 wherein the step of forming the metal containing transfer sheet disperses the metal powder in a graded distribution, from a maximum to a minimum, through the thickness of the sheet.

4. The method of claim 1 wherein the step of forming the metal containing transfer sheet disperses the metal powder in a uniform distribution through the thickness of the sheet.

5. The method of claim 1 wherein the step of forming the metal containing transfer sheet further disperses through the thickness of the sheet particles selected from the group consisting of ceramic and glass.

6. The method of claim 1 wherein the step of forming the metal containing transfer sheet disperses the metal powder through the thickness of the sheet in an amount of about 1 to 99 weight percent of the finished sheet and particles selected from the group consisting of ceramic and glass in an amount of about 99 to 1 weight percent of the finished sheet.

7. A method for making a multilayer ceramic electronic component substrate comprising;
    providing a plurality of greensheet substrates suitable for forming into a multilayer ceramic substrate;
    forming a metal containing transfer sheet without a release layer comprising a metal powder and a binder;
    applying the metal containing transfer sheet on the surface of the greensheet;
    transferring and adhering a portion of the metal containing transfer sheet in a desired pattern from the metal containing transfer sheet to the greensheet forming the desired circuit pattern on the greensheet surface;
    removing the remainder of the metal containing transfer sheet from the greensheet leaving the greensheet having the desired circuit pattern thereon;
    repeating the above procedure for the number of greensheets to be used to make the multilayer ceramic substrate;
    stacking the pattern containing ceramic greensheets; and
    laminating and sintering the stacked ceramic greensheets forming the multilayer ceramic electronic component substrate.

8. The method of claim 7 wherein the desired circuit pattern is transferred from the metal containing transfer sheet to the greensheet or other electronic component substrate by heat, pressure, stamping, laser, or a combination thereof.

9. The method of claim 7 wherein the step of forming the metal containing transfer sheet disperses the metal powder in a graded distribution, from a maximum to a minimum, through the thickness of the sheet.

10. The method of claim 7 wherein the step of forming the metal containing transfer sheet disperses the metal powder in a uniform distribution through the thickness of the sheet.

11. The method of claim 7 wherein the step of forming the metal containing transfer sheet further disperses through the thickness of the sheet particles selected from the group consisting of ceramic and glass.

12. The method of claim 7 wherein the step of forming the metal containing transfer sheet disperses the metal powder through the thickness of the sheet in an amount of about 1 to 99 weight percent of the finished sheet and particles selected from the group consisting of ceramic and glass in an amount of about 99 to 1 weight percent of the finished sheet.

13. A method for making metalized circuit patterns on a greensheet or other electronic component substrate comprising:

forming a metal containing transfer sheet comprising a metal powder and a binder wherein the metal powder is in a graded distribution, from a maximum to a minimum, through the thickness of the sheet;

applying the metal containing transfer sheet on the surface of a greensheet or electronic component substrate;

transferring and adhering a portion of the metalized transfer sheet in a desired metalized circuit pattern from the metal containing transfer sheet to the greensheet and forming the metalized circuit pattern on the greensheet surface; and removing the remainder of the metal containing transfer sheet from the greensheet leaving the patterned greensheet product.

14. A method for making a multilayer ceramic electronic component substrate comprising:

providing a plurality of greensheet substrates suitable for forming into a multilayer ceramic substrate;

forming a metal containing transfer sheet comprising a metal powder and a binder wherein the metal powder is in a graded distribution, from a maximum to a minimum, through the thickness of the sheet;

applying the metal containing transfer sheet on the surface of the greensheet;

transferring and adhering a portion of the metal containing transfer sheet in a desired pattern from the metal containing transfer sheet to the greensheet forming the desired circuit pattern on the greensheet surface;

removing the remainder of the metal containing transfer sheet from the greensheet leaving the greensheet having the desired circuit pattern thereon;

repeating the above procedure for the number of greensheets to be used to make the multilayer ceramic substrate;

stacking the pattern containing ceramic greensheets; and laminating and sintering the stacked ceramic greensheets forming the multilayer ceramic electronic component substrate.

15. An apparatus for making a greensheet having a metalized circuit pattern thereon comprising;

means to hold and support a greensheet and a metal containing transfer sheet without a release layer on the greensheet, the metal containing transfer sheet comprising a metal powder and a binder;

stamping plate means to transfer and adhere a portion of the metal containing transfer sheet to the greensheet in a desired pattern on the greensheet surface, the stamping plate having a number of raised features corresponding to the desired pattern and a height smaller than the height of the metal containing transfer sheet to provide a compressive force to the transfer sheet; and means to remove the remainder of the metal containing transfer sheet not transferred to the greensheet leaving a metalized patterned greensheet having the desired circuit pattern thereon.

16. The apparatus of claim 15 wherein the means to hold and support a greensheet comprises a vacuum plate.

17. The apparatus of claim 15 wherein the means to remove the remainder of the metal containing transfer sheet not transferred to the greensheet comprises a vacuum on a stamping plate.

* * * * *